United States Patent
Qin

(10) Patent No.: US 9,093,570 B2
(45) Date of Patent: Jul. 28, 2015

(54) FLEXIBLE LED DISPLAY SCREEN

(71) Applicant: Huasun Technology Co., Ltd, Foshan (CN)

(72) Inventor: Feizhou Qin, Foshan (CN)

(73) Assignee: Huasun Technology Co., Ltd (CN)

( * ) Notice: Subject to any disclaimer, the term of this patent is extended or adjusted under 35 U.S.C. 154(b) by 0 days.

(21) Appl. No.: 14/019,082

(22) Filed: Sep. 5, 2013

(65) Prior Publication Data
US 2014/0197727 A1   Jul. 17, 2014

(30) Foreign Application Priority Data
Jan. 15, 2013   (CN) .......................... 2013 1 0014239

(51) Int. Cl.
| | |
|---|---|
| *H01L 33/00* | (2010.01) |
| *G09F 9/30* | (2006.01) |
| *G09F 9/302* | (2006.01) |
| *G09F 9/33* | (2006.01) |

(52) U.S. Cl.
CPC ................. *H01L 33/00* (2013.01); *G09F 9/301* (2013.01); *G09F 9/3026* (2013.01); *G09F 9/33* (2013.01)

(58) Field of Classification Search
CPC .......... G09F 19/22; G09F 13/16; G09G 3/302
USPC .................. 313/500, 501, 503, 504, 507, 511
See application file for complete search history.

(56) References Cited

U.S. PATENT DOCUMENTS

| | | | | |
|---|---|---|---|---|
| 8,376,581 | B2 * | 2/2013 | Auld et al. | ............... 362/249.02 |
| 2005/0219171 | A1 * | 10/2005 | Gimbutas | ........................ 345/82 |

FOREIGN PATENT DOCUMENTS

CN   202422620   *   9/2012

OTHER PUBLICATIONS

Beijing Huasheng Lijing Technology company(, Chinese Patent application Publication CN202422620, Sep. 2012, machine translation).*

* cited by examiner

*Primary Examiner* — Tracie Y Green
(74) *Attorney, Agent, or Firm* — Lerner, David, Littenberg, Krumholz & Mentlik, LLP

(57) ABSTRACT

A flexible LED display screen is disclosed. The LED display screen includes a screen cloth, a plurality of rear pressure plates and a plurality of LED unit modules, wherein each module includes a housing, a light plate, a face shield and a plurality of LED lights which are arranged on the light plate in a array with at least two rows and two columns, the light plate is provided between the housing and the face shield, each module is connected to the front side of the screen cloth; the plurality of rear pressure plates are provided on the rear side of the screen cloth, each plate is opposite to each module respectively, a fixing hole is provided in the screen cloth, and a fixing member passes through the fixing hole to fix the rear pressure plates and the LED unit modules on two sides of the screen cloth.

9 Claims, 5 Drawing Sheets

FLEXIBLE LED DISPLAY SCREEN

CROSS-REFERENCE TO RELATED APPLICATIONS

The present application claims priority from Chinese Patent Application No. CN 201310014239.X filed in the Chinese Patent Office on Jan. 15, 2013, the disclosure of which is hereby incorporated herein by reference.

FIELD OF INVENTION

The present invention relates to the field of LED display, and more particularly to a flexible LED display screen.

BACKGROUND OF THE INVENTION

At present, known structures of LED display screens are all in box structures, that is, a plurality of hard LED display unit plates are fixed in one box structure, to form a single LED display module. In use, the modules are spliced to form one LED display screen, and then connect to a power and to a control system to play a variety of text and video images. This kind of LED display screen has following characteristics:

1. Smallest units (LED display module) for forming the LED display screen are all hard and cannot be bended and deformed, so general LED display screen is also hard and cannot be bended, and it is difficult to make a profiled LED display screen;

2. Volume and weight of the screen is relatively big, and it is difficult to transport overall. During installation, the pre-commissioning LED display screen is needed to be divided and packed separately, transported to construction site, and then the separated LED unit display modules are reassembled and commissioned to put into use. If it needs to be used in different sites, it require repeated disassembly and transport, which gives installation and transportation of the LED display screen difficult, it will consume a large amount of manpower, material and financial resources.

Currently on the market there are also some flexible LED display screens, for example, fixing a single LED light on the cloth, and then using wires on the back of the cloth to connect these LED lights, then connecting to the control section, thereby forming a flexible LED display screen. A existing flexible LED display screen is difficult to make a whole cloth qualitative LED display screen keep in a plane, and LED lights have directional light characteristics, an uneven screen leads to different emitting directions of LED lights in different locations, further causing different brightness and color, image screen uniformity, and poor imaging of the LED display screen.

BRIEF SUMMARY OF THE INVENTION

Based on the above, it is an object of the present invention to provide a flexible LED display screen. The flexible LED display screen of the invention can easily be folded, and is with small size, light weight, easy to transport and install, smooth surface of the screen, and high emitting consistency of each of the LED lights, which results in uniform image screen.

According to one aspect of the invention, a flexible LED display screen includes a screen cloth, a plurality of rear pressure plates, and a plurality of LED unit modules, wherein each of the LED unit modules includes a housing, a light plate, a face shield and a plurality of LED lights, wherein the plurality of LED lights are arranged on the light plate in a array with at least two rows and two columns, the light plate is provided between the housing and the face shield, each of the LED unit modules is connected to the front side of the screen cloth such that the LED unit modules form a LED unit module array on the screen cloth; the plurality of rear pressure plates are provided on the rear side of the screen cloth, each of the rear pressure plates is opposite to each of the LED unit modules respectively, wherein a fixing hole is provided in the screen cloth, and a fixing member passes through the fixing hole to fix the rear pressure plates and the LED unit modules on two sides of the screen cloth.

Preferably, the rear pressure plates are fixedly connected to the housing of the LED unit modules.

Preferably, at least one of the housing and the face shield comprises a bottom plate and a side plate which is provided on edge of the bottom plate and projected to forward side, and the side plate obstructs the edge of the light plate.

Preferably, the face shield is provided with a through hole or a recess, and the LED light is located in the through hole or the recess.

Preferably, a protective rib projecting forwardly is provided on the front surface of the face shield.

Preferably, edges of the two adjacent LED unit modules are connected to each other by a connecting piece.

Preferably, at least on the edge of the back side of the LED unit modules, there is provided a splice bracket projecting to the back side direction.

Preferably, the LED display screen further includes a controller and a power input end electrically connected to the controller, and the controller is electrically connected to the light plate of the LED unit modules by connecting wires, each of the LED lights electrically connected to the light plate.

Preferably, the LED display screen further comprises a protective cloth located on the rear side of the screen cloth, and the edge of the protective cloth is connected to the edge of the screen cloth, so as to form a enclosure-protection space between the protective cloth and the screen cloth, and the controller and the connecting wires are both located in the enclosure-protection space.

It should be noted that, the "screen cloth" and "protective cloth" need to bear relatively large tension, and they may be polyester fabric, woven fabric, plastic sheet or traditional cloth, or textile fabric processed by other means. If fabric with high strength and flame retardant is used, the effect will be better.

The advantages and principles of the above mentioned technical solutions will be described below:

1. The flexible LED display screen includes a plurality of LED unit modules, and each of the LED unit modules has a light plate provided with a plurality of LED lights arranged in an array, which not only achieves the foldable capacity of the LED display screen, but also effectively ensures the smoothness of the entire LED display screen, so that the LED lights are of good emitting consistency, so that a uniform image screen can be obtained.

2. A rear pressure plate opposite to each of the LED unit modules is provided on the other side of the screen cloth. During installation, the screen cloth is pressed tightly on two sides by the LED unit modules and the rear pressure plate, and the fixation is firm, so as to prevent each of the LED unit modules from detaching from the screen cloth or looseness.

3. Each of the LED unit modules further includes a housing in which the light plate is provided, and the rear pressure plate is fixedly connected to the housing, the housing protects the LED light plate and LED lights, and the rear pressure plate is fixedly connected to the housing, so that the damage to the light plate can be reduced.

4. The side plate of the housing or the face shield obstructs the edge of the light plate, and the housing may house the LED lights and the light plate, better playing a protective role on the LED lights and the light plate, and having waterproof effect.

5. Each of the LED unit modules also comprises a face shield, which plays a protective role on the light plate and LED lights on the front of the light plate.

6. A protective rib projecting forwardly is provided on the front surface of the face shield, when in use or folded, the protective rib plays a protective role on the LED lights, to prevent the LED lights from being damaged by foreign objects, and when in work, it can also prevent glare.

7. Edges of two adjacent LED unit modules are connected to each other by a connecting piece, the connecting piece is elastic and can rebound after bending, two adjacent LED unit modules can be folded into each other and will not produce dislocation or skew; when expanded, the connecting piece can make sure that two adjacent LED unit modules are connected smoothly and flush with each other, that is very important for maintaining the smoothness of the entire LED display screen.

8. Each of the LED unit modules is shaped in rectangular, to facilitate folding, and a folding gap is provided between two adjacent LED unit modules, to avoid producing interference between the two adjacent LED unit modules during folding.

9. At least on the edge of the back side of the LED unit modules, there is provided a splice bracket projecting to the back side direction, and during installation, a plurality of LED display screens can be spliced together again by the splice bracket, to form larger display screen.

10. A protective cloth is further provided on the back side, forming a enclosure-protection space between the protective cloth and the screen cloth, and the controller and the connecting wires are located in the enclosure-protection space, to prevent the controller and the connecting wires from water, damage or winding, also achieves an aesthetic effect.

EXPLANATION OF THE REFERENCE NUMBERS

Figure 1:
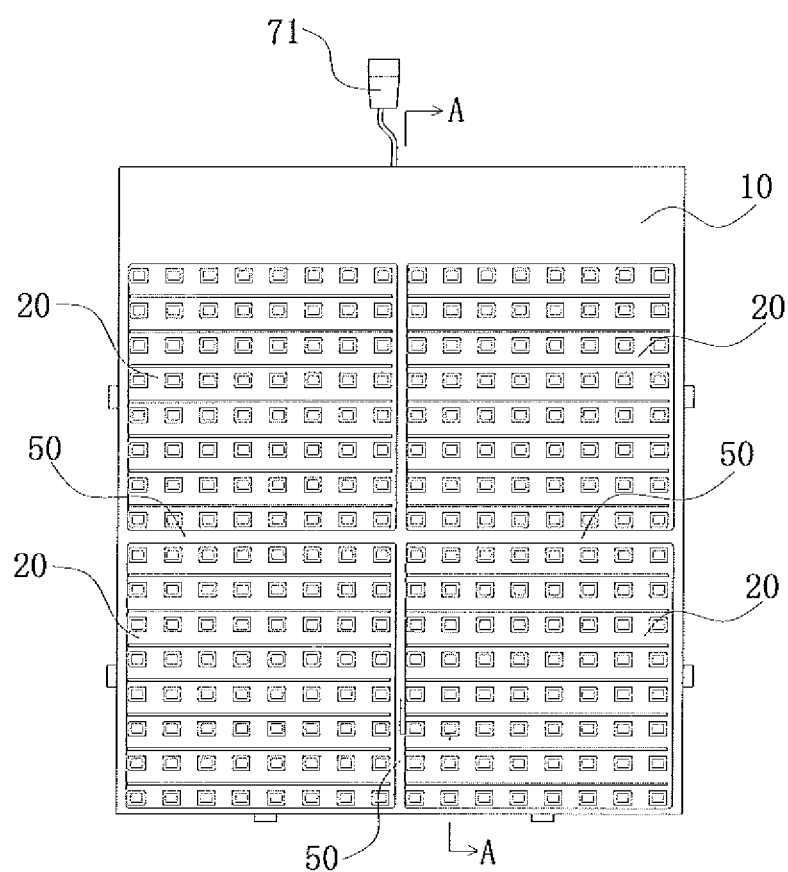
FIG. 1 is a front structure view of a flexible LED display screen according to the first embodiment of the invention.
Figure 2:
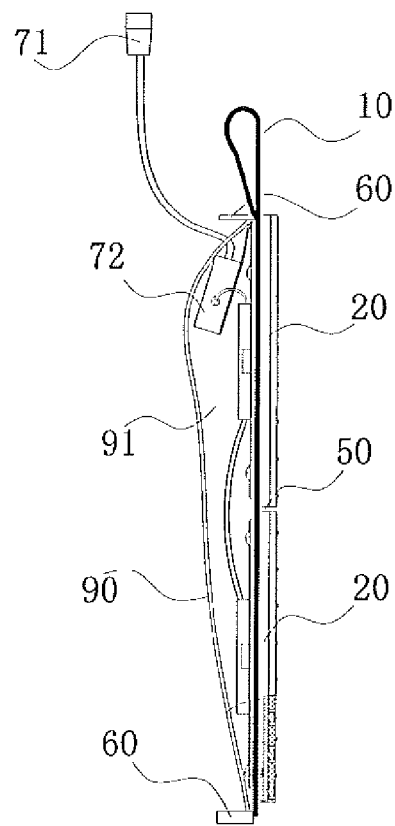
FIG. 2 is a cross sectional view along a A-A line of FIG. 1.
Figure 3:
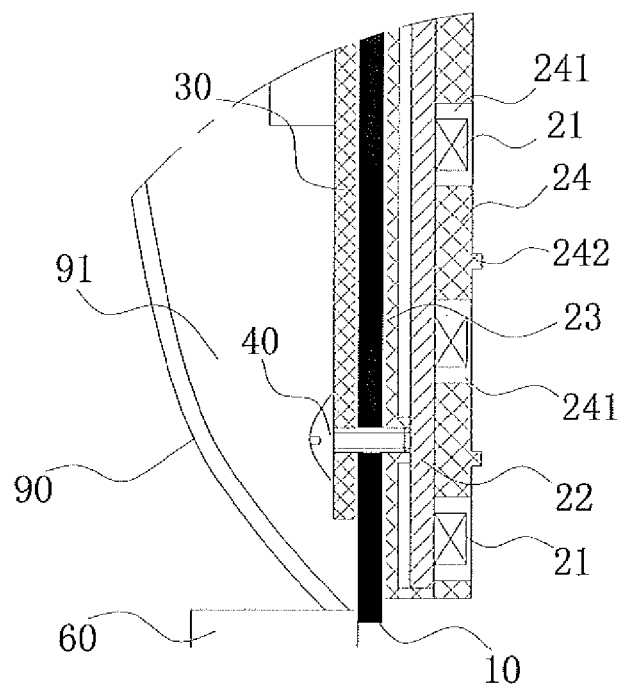
FIG. 3 is a partially enlarged view of FIG. 2.
Figure 4:
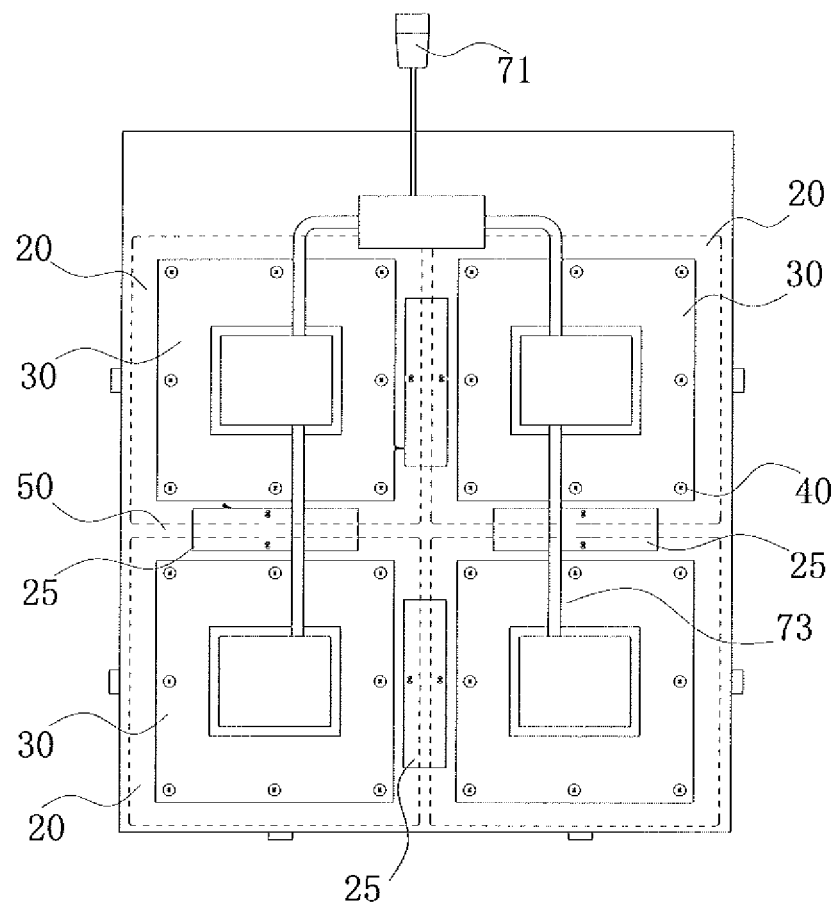
FIG. 4 is a back structure view of the flexible LED display screen according to the first embodiment of the invention.
Figure 5:
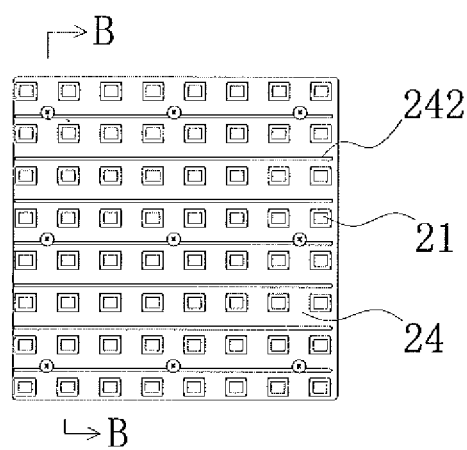
FIG. 5 is a front structure view of the flexible LED unit module according to the first embodiment of the invention.
Figure 6:
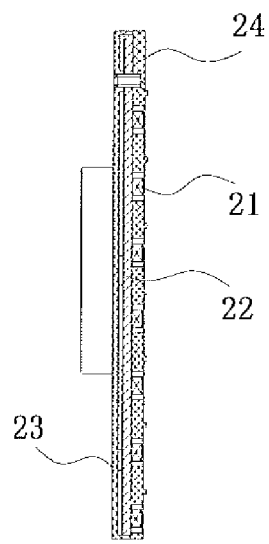
FIG. 6 is a cross sectional view along B-B of FIG. 5.
Figure 7:
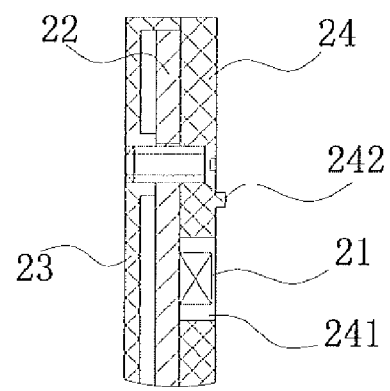
FIG. 7 is a partially enlarged view of FIG. 6.

10—screen cloth,
20—LED unit module,
21—LED light,
22—light plate,
23—housing,
24—face shield,
241—through hole,
242—protective rib,
243—recess,
25—connecting piece,
30—rear pressure plate,
40—fixing member,
50—folding gap,
60—splice bracket,
71—power input end,
72—controller,
73—connecting wire,
90—protective cloth,
91—enclosure-protection space.

DETAILED DESCRIPTION

Embodiments of the present invention will be described in detail in the following:

EXAMPLE 1

As shown in FIGS. 1 to 7, a flexible LED display screen includes a screen cloth 10, a plurality of rear pressure plates 30 and a plurality of LED unit modules 20, wherein each of the LED unit modules 20 includes a housing 23, a light plate 22, a face shield 24 and a plurality of LED lights 21, wherein the plurality of LED lights 21 are arranged on the light plate 22 in a array with at least two rows and two columns, the light plate 22 is provided between the housing 23 and the face shield 24, each of the LED unit modules 20 is connected to the front side of the screen cloth 10 such that the LED unit modules 20 form a LED unit module 20 array on the screen cloth 10.

Wherein the plurality of rear pressure plates 30 are provided on the rear side of the screen cloth 10, and each of the rear pressure plates 30 is opposite to each of the LED unit modules 20 respectively. Nine fixing holes are provided in the screen cloth 10, a fixing member 40 (in this embodiment, the fixing member 40 is a fixing screw) passes through the fixing holes to fix the rear pressure plates 30 and the LED unit modules 20 on two sides of the screen cloth 10. The housing 23 includes a bottom plate and a side plate which is provided on the edge of the bottom plate and projected forwardly, and the side plate obstructs the edge of the light plate 22. The face shield 24 is provided with through holes 241, and the LED lights 21 are located in the through holes 241. The front surface of the face shield 24 is flushed with that of the LED lights 21, and a protective rib 242 projecting forwardly is provided on the front surface of the face shield 24. The fixing member 40 may be provided in the front of the LED unit module 20, or in the rear of the LED unit module 20.

Each of the LED unit modules 20 is shaped in rectangular, and a folding gap 50 is provided between two adjacent LED unit modules 20. On the edge of the back side of the LED unit modules 20, there is provided a splice bracket 60 (particularly comprising upper bracket, lower bracket, left bracket and right bracket) projecting to the back side direction. The flexible LED display screen further includes a controller 72, a power input end 71 and a protective cloth 80, the power input end 71 is electrically connected to the controller 72, and the controller 72 is electrically connected to the light plate 22 of the LED unit modules 20 by connecting wires 73, each of the LED lights 21 is electrically connected to the light plate 22. The protective cloth 80 is located on the rear side of the screen cloth 10, and the edge of the protective cloth 80 is connected to the edge of the screen cloth 10, so as to form a enclosure-protection space 91 between the protective cloth 80 and the screen cloth 10, wherein the controller 72 and the connecting wire 73 are both located in the enclosure-protection space 91.

The advantages of Example 1 are as follows:

1. The flexible LED display screen includes a plurality of LED unit modules 20, and each of the LED unit modules 20 has a light plate 22 provided with a plurality of LED lights 21 arranged in an array, which not only achieves the folding of the LED display screen, but also effectively ensures the smoothness of the entire LED display screen, so that the LED lights 21 are of good emitting consistency, and have evenly image screen.

2. A rear pressure plate 30 opposite to each of the LED unit modules 20 is provided on the other side of the screen cloth 10. During installation, the screen cloth 10 is pressed tightly on two sides by the LED unit modules 20 and the rear pressure plate 30, and the fixation is firm, to avoid each of the LED unit modules 20 detaching from the screen cloth 10 or looseness.

3. Each of the LED unit modules 20 further includes a housing 23 in which the light plate 22 is provided, the rear pressure plate 30 is fixedly connected to the housing 23, the housing 23 protects the LED light plate 22 and LED lights 21, and the rear pressure plate 30 is fixedly connected to the housing 23, so that the damage to the light plate 22 can be reduced.

4. The side plate of the housing 23 obstructs the edge of the light plate 22, and the housing 23 may house the LED lights 21 and the light plate 22, better playing a protective role on the LED lights 21 and the light plate 22, and obtaining waterproof effect.

5. Each of the LED unit modules 20 also includes a face shield 24, which plays a protective role on the light plate 22 and LED lights 21 on the front of the light plate 22.

6. A protective rib 242 projecting forwardly is provided on the front surface of the face shield 24, when in use or folded, the protective rib 242 plays a protective role on the LED lights 21, to avoid foreign objects damaging the LED lights 21, and when in work, it can also prevent glare.

7. Edges of the two adjacent LED unit modules 20 are connected to each other by a connecting piece 25, the connecting piece 25 is elastic and can rebound after bending, two adjacent LED unit modules 20 can be folded into each other and will not produce dislocation or skew, when expanded, it can ensure the smoothness between the LED unit modules 20, which is important to keep the smoothness of the entire LED display screen.

8. Each of the LED unit modules 20 is shaped in rectangular, to facilitate folding, and a folding gap 50 is provided between two adjacent LED unit modules 20, to avoid producing interference between the two adjacent LED unit modules 20 during folding.

9. At least on the edge of the back side of the LED unit modules 20, there is provided a splice bracket 60 projecting to the back side, and during installation, a plurality of LED display screens can be spliced together again by the splice bracket 60, to form larger display screen.

10. A protective cloth 80 is further provided on the back side, to form a enclosure-protection space 91 between the protective cloth 80 and the screen cloth 10, wherein the controller 72 and the connecting wires 73 are located in the enclosure-protection space 91, so as to prevent the controller 72 and the connecting wires 73 from water, damage or winding, also with aesthetic effect.

EXAMPLE 2

Figure 8:
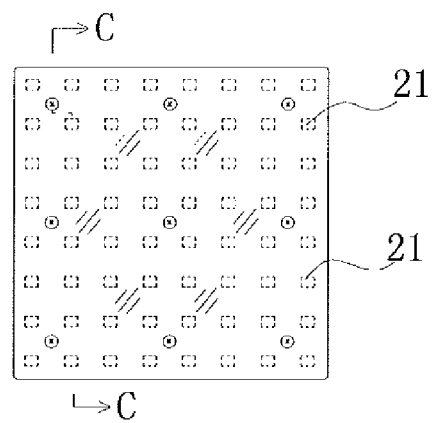
FIG. 8 is a front structure view of the LED unit module according to the second embodiment of the invention.
Figure 9:
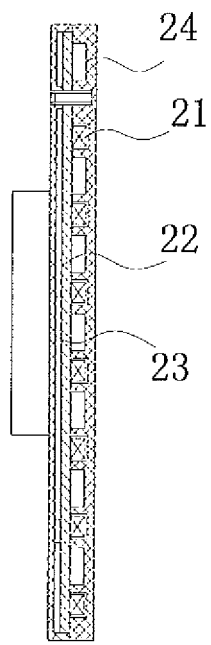
FIG. 9 is a cross sectional view along a C-C line of FIG. 8.
Figure 10:
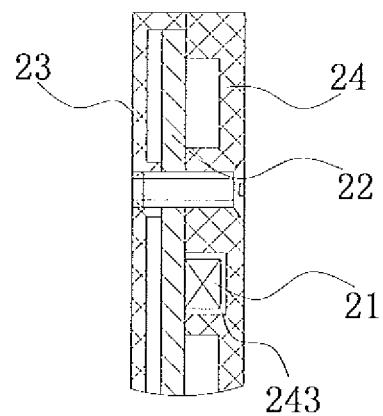
FIG. 10 is a partially enlarged view of FIG. 9.

As shown in FIGS. 8 to 10, in this embodiment, the face shield 24 is provided with a recess 243. The face shield 24 is made of transparent material; during installation, the light plate 22 and the LED lights 21 are wrapped entirely by the face shield 24 and base housing, which results in a good waterproof effect.

The above described embodiments are aimed to illustrate the specific embodiments of the present invention, the description thereof is relatively specific, but it should not be understand as limiting the scope of the present invention. It should be noted that, for a person skilled in the art, without departing from the inventive concept, a number of variations and modifications which fall into the scope of the invention may be made.

The invention claimed is:

1. A flexible LED display screen, comprising:
    a screen cloth;
    a plurality of rear pressure plates; and
    a plurality of LED unit modules;
    wherein each of the LED unit modules comprises a housing, a light plate, a face shield and a plurality of LED lights;
    the plurality of LED lights are arranged on the light plate in an array with at least two rows and two columns;
    the light plate is provided between the housing and the face shield;
    each of the LED unit modules is connected to the front side of the screen cloth such that the LED unit modules form a LED unit module array on the screen cloth;
    the plurality of rear pressure plates are provided on the rear side of the screen cloth, each of the rear pressure plates is opposite to each of the LED unit modules respectively;
    a fixing hole is provided in the screen cloth; and
    a fixing member passes through the fixing hole to fix the rear pressure plates and the LED unit modules on two sides of the screen cloth.

2. The flexible LED display screen of claim 1, wherein the rear pressure plates are fixedly connected to the housing of the LED unit modules.

3. The flexible LED display screen of claim 1, wherein at least one of the housing and the face shield comprises a bottom plate and a side plate which is provided on an edge of the bottom plate and projects forwardly, wherein the side plate obstructs the edge of the light plate.

4. The flexible LED display screen of claim 1, wherein the face shield is provided with a through hole or a recess, and the LED light is located in the through hole or in the recess.

5. The flexible LED display screen of claim 4, wherein a protective rib projecting forwardly is provided on the front surface of the face shield.

6. The flexible LED display screen of claim 1, wherein edges of two adjacent LED unit modules are connected to each other by a connecting piece.

7. The flexible LED display screen of claim 1, wherein a splice bracket projecting to the back side direction is at least provided on the edge of the back side of the LED unit modules.

8. The flexible LED display screen of claim 1, wherein the LED display screen further comprises a controller and a power input end electrically connected to the controller, wherein the controller is electrically connected to the light plates of the LED unit modules by connecting wires, each of the LED lights is electrically connected to the light plate.

9. The flexible LED display screen of claim 8, wherein the LED display screen further comprises a protective cloth located on the back side of the screen cloth, and the edge of the protective cloth is connected to the edge of the screen cloth, so as to form an enclosure-protection space between the protective cloth and the screen cloth, wherein the controller and the connecting wires are both located in the enclosure-protection space.

* * * * *